(12) United States Patent
Luo et al.

(10) Patent No.: US 8,643,170 B2
(45) Date of Patent: Feb. 4, 2014

(54) METHOD OF ASSEMBLING SEMICONDUCTOR DEVICE INCLUDING INSULATING SUBSTRATE AND HEAT SINK

(75) Inventors: Junhua Luo, Tianjin (CN); Jinzhong Yao, Tianjin (CN); Baoguan Yin, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/442,878

(22) Filed: Apr. 10, 2012

(65) Prior Publication Data
US 2012/0264258 A1  Oct. 18, 2012

(30) Foreign Application Priority Data
Apr. 15, 2011  (CN) .......................... 2011 1 0094128

(51) Int. Cl.
*H01L 23/34*  (2006.01)
(52) U.S. Cl.
USPC ..... 257/706; 257/707; 257/718; 257/E23.083
(58) Field of Classification Search
USPC .................. 257/667, 706, 707, 718, E21.504, 257/E23.083, E23.084; 438/113, 122, 125, 438/126
See application file for complete search history.

(56) References Cited

U.S. PATENT DOCUMENTS

| | | | |
|---|---|---|---|
| 5,091,341 A * | 2/1992 | Asada et al. | 29/827 |
| 6,917,097 B2 | 7/2005 | Chow et al. | |
| 7,183,630 B1 | 2/2007 | Fogelson | |
| 8,278,742 B2 * | 10/2012 | Wu et al. | 257/675 |
| 8,373,277 B2 * | 2/2013 | Tan et al. | 257/777 |
| 2006/0087038 A1 * | 4/2006 | Foong | 257/738 |
| 2007/0278632 A1 | 12/2007 | Zhao | |
| 2008/0122113 A1 * | 5/2008 | Corisis et al. | 257/777 |
| 2008/0212288 A1 * | 9/2008 | Kang et al. | 361/717 |
| 2009/0261482 A1 | 10/2009 | Brown | |

* cited by examiner

*Primary Examiner* — Tuan N. Quach
(74) *Attorney, Agent, or Firm* — Charles Bergere

(57) ABSTRACT

Semiconductor dies are mounted on a heat sink array frame structure. The heat sink array frame structure and the semiconductor dies are assembled together with an insulating substrate that has a corresponding array of apertures on an adhesive tape. The semiconductor dies are connected electrically with electrical contacts on the insulating substrate. The semiconductor dies, heat sinks and electrical connections to the contacts are encapsulated with a mold compound and then the encapsulated array is de-taped and singulated.

6 Claims, 3 Drawing Sheets

METHOD OF ASSEMBLING SEMICONDUCTOR DEVICE INCLUDING INSULATING SUBSTRATE AND HEAT SINK

BACKGROUND OF THE INVENTION

The present invention is directed to semiconductor packaging, and, more particularly, to a method of assembling a semiconductor device including a semiconductor die with an insulating substrate and a heat sink.

Semiconductor device packaging fulfils basic functions such as providing electric connections and protecting the die against mechanical and environmental stresses. The completed semiconductor device may be mounted on a support with electrical connectors, such as a printed circuit board ('PCB'), for example. The semiconductor device may have exposed external electrical contact surfaces or leads for connection to the electrical connectors on the support. Using surface mount technology, external electrical contact surfaces or leads of the package can be soldered directly to corresponding pads on the support, providing mechanical attachment as well as electrical connections.

Semiconductor devices are commonly packaged for surface mounting by encapsulating one or more semiconductor dies, the encapsulation process including embedding the die or dies in a molding compound. Various techniques are available for connecting the external electrical contact surfaces or leads of the package internally with electrical contact pads on the embedded semiconductor die.

In a wire bonded package, the die may be mounted on a die support with the contact pads of the die on its active face opposite from the die support. Wires may then be bonded to the contact pads and to the external electrical contact surfaces or leads of the package to provide the internal connections, before encapsulation.

In a lead frame type package, the die support may be an electrically conductive lead frame, whose frame members are cut off and discarded during production, to isolate the electrical contact surfaces or leads of the package from each other, after applying molding compound to encapsulate the die, the internal connections and the external electrical contacts from the lead frame. With this technique, the external electrical contacts of the package may be disposed around the periphery of the semiconductor die, either in an active face of the finished device or at edges of the device. However, the minimal pitch and the numerical density of the external electrical contacts is limited by the risk of short circuits between adjacent contacts.

In an insulating substrate package, such as a laminate base package or ceramic base package, the die may be mounted on an electrically insulating substrate bearing the external electrical contact surfaces. Examples of laminate base packages include ball grid array (BGA), pin grid array (PGA) and land grid array (LGA) packages. In one technique of insulating substrate packages, before encapsulation, internal connections are made by wire bonding between the contact pads of the die and the external electrical contact surfaces. After encapsulation, an array of solder balls or studs may be applied to the external electrical contact surfaces, typically before singulation of the encapsulated devices. In place of the balls or pins, LGA packages have metal pads, of bare gold-plated copper for example, that are contacted in use by pins on a mother board.

Such insulating substrate packages enable a smaller pitch and a higher numerical density of the external electrical contacts. However, typically the electrically insulating substrate is also thermally insulating. For certain types of semiconductor devices, such as high power devices for example, it is desirable to mount the semiconductor die or dies on a heat sink element, such as a metal or other thermally conductive flag, distributing internally generated heat over the face of the semiconductor die or dies and dissipating the heat, by conduction radiation and/or convection.

It is desirable that provision of a heat sink in an insulating substrate semiconductor die package should minimize complication of the packaging process and not increase costs.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS

Figure 1:
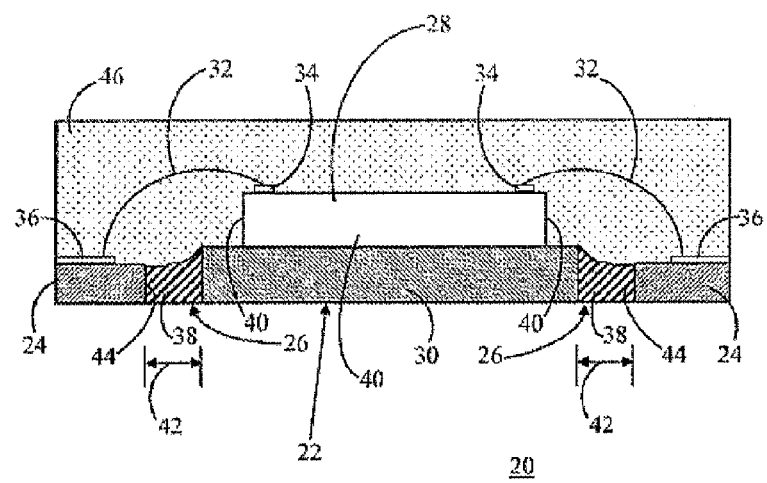
FIG. 1 is a schematic sectional view of a semiconductor device comprising a semiconductor die with an insulating substrate and a heat sink made by a known method.

FIG. 1 shows a semiconductor device 20 comprising a semiconductor die with an insulating substrate 24 and a heat sink element 30 made by a known method. Semiconductor package 20 includes a semiconductor die subassembly 22 integrated into the electrically insulating organic substrate 24. Semiconductor die subassembly 22 includes a semiconductor die 28 bonded to an underlying platform layer 30, forming the heat sink element. Organic substrate 24 has an array of openings 26 in which semiconductor die subassemblies 22 are positioned. Electrical interconnects 32, such as bonding wires, connect pads 34 of semiconductor dies 28 to electrical contacts 36 formed in organic substrate 24. An elastomeric adhesive 38 secures semiconductor die subassemblies 22 in openings 26 of organic substrate 24. Openings 26 are larger than the outer perimeters 40 of semiconductor die subassemblies 22. Accordingly, gaps 42 are formed between the edges 44 of organic substrate 24 and perimeters 40 of semiconductor die subassemblies 22. Gaps 42 are sealed with elastomeric adhesive 38. A molding material 46 encapsulates semiconductor die subassemblies 22, organic substrate 24, electrical interconnects 32, and elastomeric adhesive 38.

During manufacture of the device of FIG. 1, individual semiconductor dies 28 are bonded to individual heat sink platform layers 30 to form subassemblies 22. A single-sided adhesive tape is applied to the underside of organic substrate 24. The semiconductor die subassemblies 22 are then picked and placed individually in respective openings 26 of the organic substrate 24 and undergo the remainder of the fabrication process. In particular, platform layers 30 of semiconductor die subassemblies 22 are placed in openings 26 of organic substrate 24 and are temporarily secured to the adhesive tape. The elastomeric adhesive 38 is utilized to secure semiconductor die subassemblies 22 in opening 26. The elastomeric adhesive 38 fills gaps 42 surrounding platform layers 30 of semiconductor die subassemblies 22. The presence of adhesive tape largely prevents a flow of elastomeric adhesive 38 underneath semiconductor die subassemblies 22 and/or underneath organic substrate 24.

Subsequently, electrical interconnects 32 are formed between semiconductor die 28 and organic substrate 24 at task 106. The organic substrate 24, semiconductor die subassemblies 22, elastomeric adhesive 38, and electrical interconnects 32 are encapsulated with molding compound 46, such as an epoxy resin. The adhesive tape is removed from the underside of organic substrate 24, as well as from elastomeric adhesive 38 and an underside of platform layers 30 of semiconductor die subassemblies 22. Once encapsulated, molding compound 46 and elastomeric adhesive 38 hold semiconductor die subassemblies 22 in the proper position within openings 26 of organic substrate 24.

Figure 2:
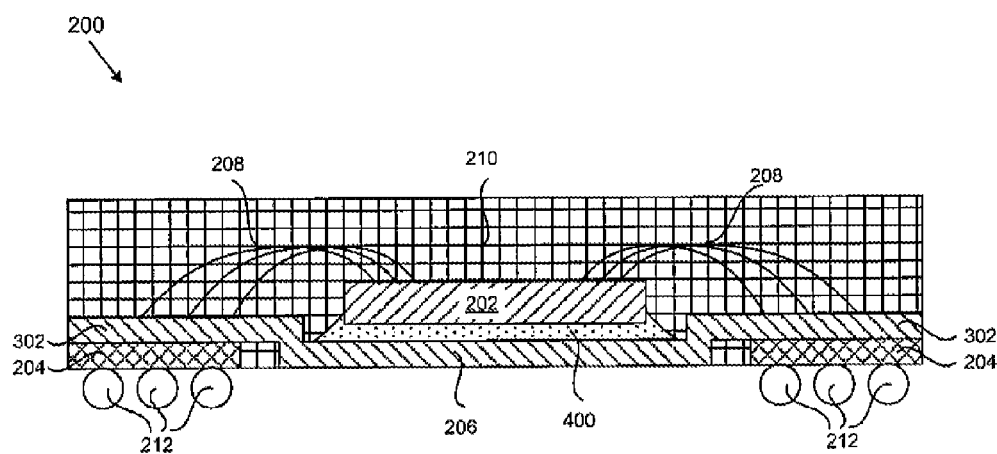
FIG. 2 is a schematic sectional view, taken at a position corresponding to the arrows 2-2 of FIG. 7, of a semiconductor device comprising a semiconductor die with an insulating substrate and a heat sink, made by a method in accordance with an embodiment of the present invention.
Figure 6:
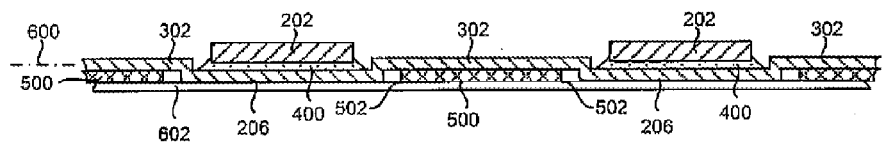
FIG. 6 is a detailed sectional view, taken at a position corresponding to the arrows 2-2 of FIG. 7, of part of the array of semiconductor dies mounted on the heat sink array structure of FIG. 4 assembled with the electrically insulating substrate of FIG. 5 at an intermediate stage of manufacture.
Figure 7:
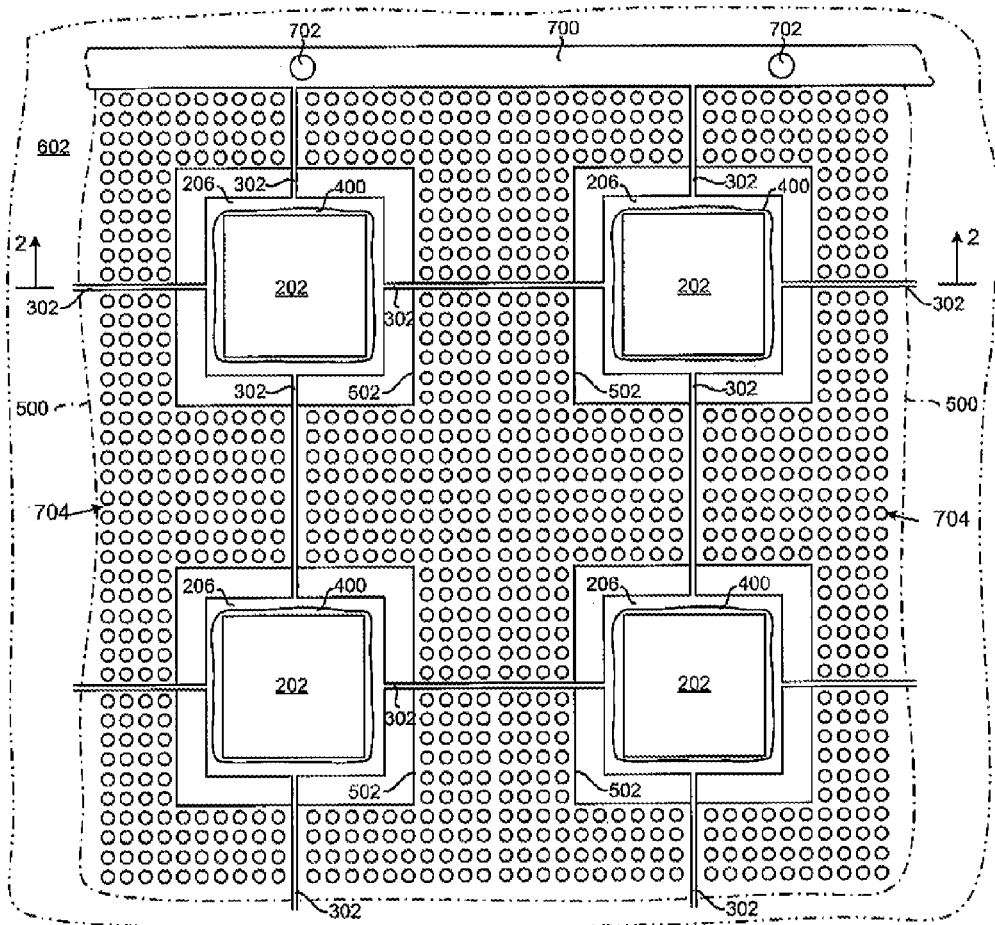
FIG. 7 is a schematic plan view of the part of the assembly shown in FIG. 6 at the same intermediate stage of manufacture.
Figures 8, 9:
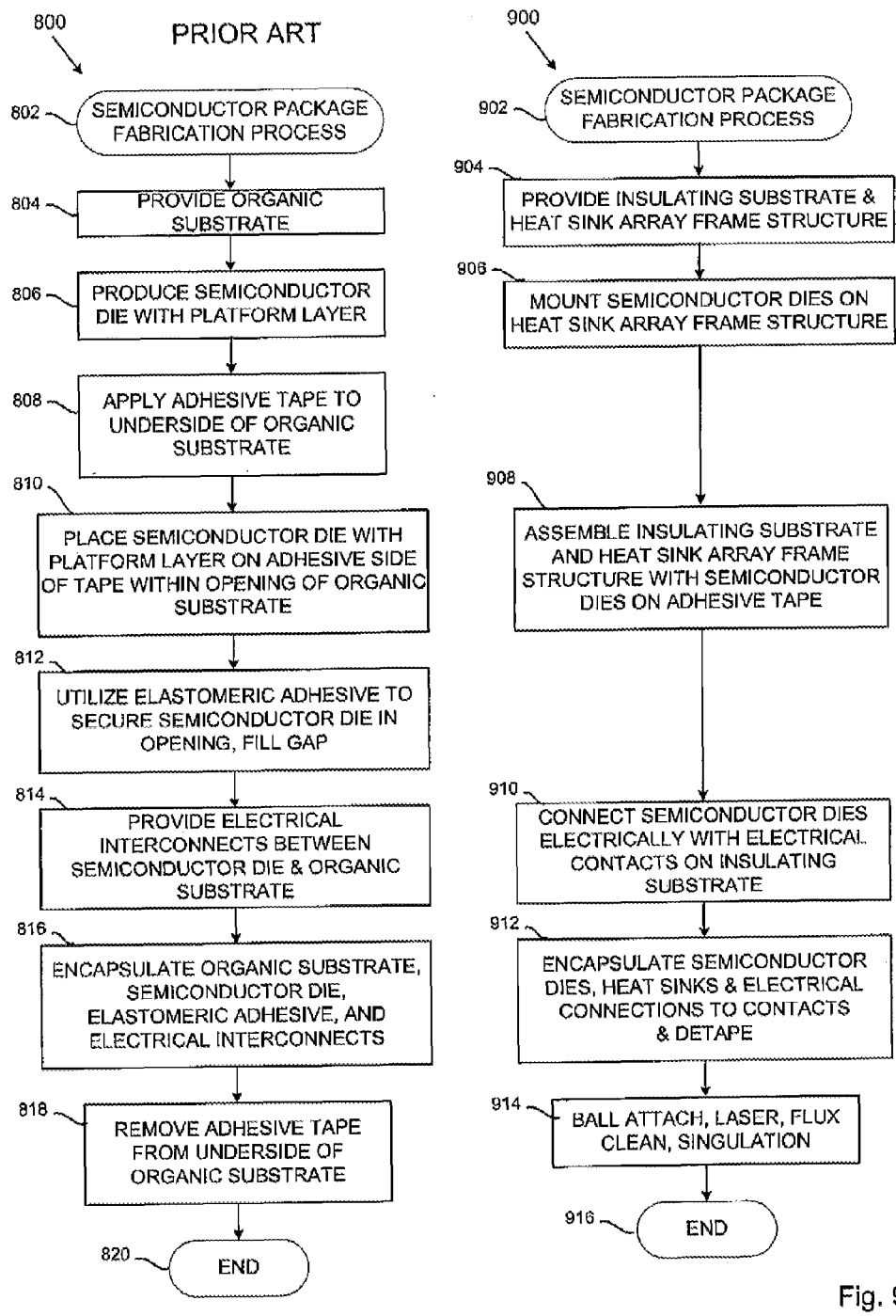
FIG. 8 is a simplified flow chart of a known method of assembling the semiconductor device of FIG. 1.
FIG. 9 is a simplified flow chart of a method of assembling the semiconductor device of FIG. 2 in accordance with an embodiment of the present invention.

FIGS. 2 to 7 illustrate various stages of a method 900 of assembling a semiconductor device 200 in accordance with an embodiment of the present invention, given by way of example and summarized in a flow chart in FIG. 9. The semiconductor device 200 comprises a semiconductor die 202, an insulating substrate 204 (referred to as element 500 in FIGS. 5 and 6) and a heat sink that includes a heat sink element 206 and a tie bar 302. FIG. 2 is a sectional view of the semiconductor device 200, taken at a position corresponding to the arrows 2-2 of FIG. 7, after connecting the semiconductor die 202 electrically by attaching bond wires 208 with electrical contact elements (not shown in FIG. 2), encapsulating in a molding compound 210, applying an array of solder balls 212 to external electrical contact surfaces, and singulating the encapsulated units.

Figure 3:
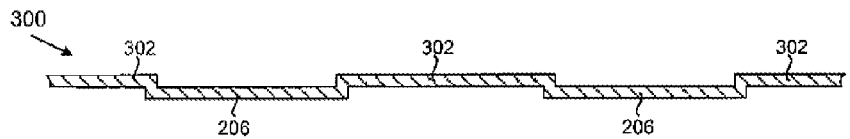
FIG. 3 is a schematic sectional view, taken at a position corresponding to the arrows 2-2 of FIG. 7, of part of a heat sink array structure in the semiconductor device of FIG. 2 at an intermediate stage of manufacture.

The method 900 includes providing a heat sink array structure 300, shown in cross-section in FIG. 3, comprising an array of heat sink elements 206 supported by a heat sink support frame (not shown in FIG. 3). Providing the heat sink array structure 300 comprises cutting and forming a sheet of thermally conductive material.

Figure 4:
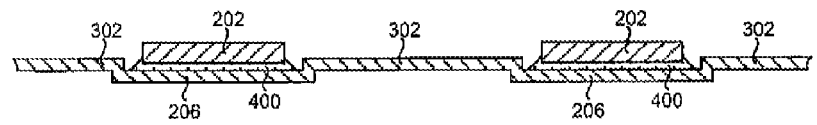
FIG. 4 is a schematic sectional view, taken at a position corresponding to the arrows 2-2 of FIG. 7, of part of an array of semiconductor dies mounted on the heat sink array structure of FIG. 3 at an intermediate stage of manufacture.

The method 900 also includes mounting an array of semiconductor dies 202 on the array of heat sink elements 206 of the structure 300, as shown in FIG. 4. The semiconductor dies 202 may be picked and placed individually on the heat sink elements 206 and secured thereto with a thermally conductive adhesive paste or solder 400.

The heat sink array structure 300 includes the tie bars 302 connecting the heat sink elements 206 mechanically with the heat sink support frame (700 in FIG. 7), so that the tie bars 302 and the heat sink support frame 700 support the heat sink elements 206. It should be noted from FIG. 2 that both the heat sink element 206 and the tie bars 302 provide paths for heat dissipation from the die 202 to the external environment. That is, in addition to the typical heat sink element 206 found in many types of semiconductor devices, the tie bars 302 extend outwardly from the four sides of the heat sink elements 206 and to an outside edge of the semiconductor device 200 and thus provide an additional path for heat dissipation.

Figure 5:
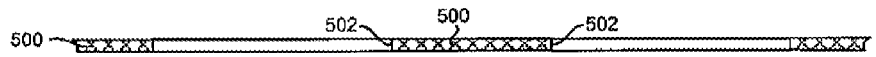
FIG. 5 is a schematic sectional view, taken at a position corresponding to the arrows 2-2 of FIG. 7, of part of an electrically insulating substrate in the semiconductor device of FIG. 2 at an intermediate stage of manufacture.

The method 900 also includes providing an electrically insulating substrate 500 presenting an array of apertures 502 and bearing electrical contact elements (not seen in FIG. 5). The array of apertures 502 is geometrically identical to the array of heat sink elements 206 of the structure 300, except that the apertures 502 are wider in each of the two dimensions than the heat sink elements 206.

As shown in FIG. 6, the method 900 also includes assembling together the electrically insulating substrate 500 and the heat sink array structure 300 with the array of heat sink elements 206 disposed in the array of apertures 502 and bearing the array of semiconductor dies 202. In this example of the method 900, the heat sink elements 206 are offset from a plane 600 in which the heat sink support frame 700 and tie bars 302 extend, so that the heat sink elements 206 are disposed in the array of apertures 502 when the heat sink array structure 300 and the electrically insulating substrate 500 are assembled with the heat sink support frame 700 abutting the electrically insulating substrate 500. In this example, the electrically insulating substrate 500 is mounted on an adhesive tape 602, before the heat sink array structure 300 bearing the array of semiconductor dies 202 is placed in a single operation in alignment on the electrically insulating substrate 500 and the adhesive tape 602.

FIG. 7 is a plan view of the assembly shown in sectional view in FIG. 6. The heat sink support frame 700 surrounds the heat sink array structure 300. The heat sink support frame 700 includes alignment holes 702 that register with pins of an alignment tool (not shown) also registering with corresponding alignment holes (not shown) in the electrically insulating substrate 500 for aligning the array of heat sink elements 206 with the array of apertures 502. In this example, assembling together with the heat sink array structure 300 includes positioning the heat sink array structure and the electrically insulating substrate on the adhesive tape 602, which is removed after encapsulation. The solder balls 212 are attached to electrical contact elements 704 of the electrically insulating substrate 500. The contact elements 704 extend through the thickness of the insulating substrate 500. In one embodiment, the electrical contact elements comprise plated vias formed in the substrate 500. The wires 208 connect the semiconductor dies 202 electrically with the electrical contact elements 704. The wires 208 may be attached using commercially available wire bonding equipment. It will be appreciated that the heat sink array structure 300, including the heat sink elements 206, the tie bars 302 and the heat sink support frame 700, is spaced from the electrical contact elements 704 and the wires 208, so as to maintain electrical isolation from them, in particular by the molding compound 210 after encapsulation.

After connecting the semiconductor dies electrically with the electrical contact elements 704, by bonding the wires 208 for example, the method 900 also includes encapsulating in a molding compound 210 the array of semiconductor dies 202 mounted on the array of heat sink elements 206 and assembled with the electrically insulating substrate 500, on the adhesive tape 602. The encapsulated units of the semiconductor dies 202 with the corresponding heat sink elements 206, tie bars 302, and surrounding portions of the electrically insulating substrate 500 then singulated, thereby providing the device shown in FIG. 2. Singulation may include sawing or punching along streets between adjacent units of the array, for example, severing the tie bars 302 and detaching and discarding the heat sink support frame 700 to leave the encapsulated units with the semiconductor dies 202, the corresponding heat sink elements 206, the tie bars 302, surrounding portions of the electrically insulating substrate 500 and connected electrical contact elements 704. The molding compound 210 joins the semiconductor dies 202 with the corresponding heat sink elements 206 and with surrounding portions of the electrically insulating substrate 500 and the electrical contact elements 704 in the encapsulated units.

FIG. 8 is a simplified flow chart that summarizes a known method of producing the semiconductor device 20 of FIG. 1. The method 800 starts a semiconductor package fabrication process at 802. At 804, an electrically insulating organic substrate 24 is provided. At 806, individual semiconductor dies 28 are bonded to individual heat sink platform layers 30 to form subassemblies 22 of semiconductor dies with heat sink platform layers 30. At 808, adhesive tape is applied to the underside of organic substrate. At 810, the semiconductor die subassemblies 22 are then picked and placed individually in respective openings 26 of the organic substrate 24 by placing each semiconductor die subassembly 22 with its platform layer 30 on the adhesive side of tape within the respective opening 26 of organic substrate 24. Adhesive 38 is used at 812 to secure each of the semiconductor die subassemblies 22 in the corresponding openings 26, and to fill the gaps 42. The method 800 continues at 814 by providing electrical interconnects 32 between the semiconductor dies 28 and contacts of the organic substrate 24, encapsulating the organic substrate 24, the semiconductor dies 28, the adhesive 38, and the electrical interconnects 32 at 816, and removing the adhesive tape from the underside of the organic substrate 24 at 818 and terminates at 820.

The method 900 of making the semiconductor device 200 of FIG. 2 in accordance with an embodiment of the present invention, given by way of example, is summarized in a simplified flow chart in FIG. 9.

The method 900 starts a semiconductor package assembly process at 902. At 904, an electrically insulating substrate 500 and a heat sink array frame structure 300 are provided. At 906, the semiconductor dies 202 are mounted on the heat sink array frame structure 300. At 908, the insulating substrate 500 and the whole heat sink array frame structure 300 with the semiconductor dies 202 thereon are assembled together on adhesive tape. The method continues with steps generally similar to the steps 814 to 820 of the method 800. More specifically, the method 900 continues at 910 by connecting the semiconductor dies 202 electrically with the electrical contacts 704 on the insulating substrate 500. The semiconductor dies 202, the heat sink elements 206 and the electrical connections 208 to the contacts 704 are encapsulated at 912 followed by de-taping the encapsulated arrays and post-molding cure of the molding compound. At 914 the solder balls 212 are attached, followed by laser and flux clean operations, and then singulation, and the method 900 ends at 916.

It will be appreciated that the method 900 avoids manipulating individual sub-assemblies 22 to place them individually in respective openings 26, and applying elastomeric adhesive 38 to secure each individual semiconductor die subassembly 22 in the corresponding opening 26, as in the method 800. A substantial simplification of the packaging process and reduction of costs ensues. It will also be appreciated that the tie bars 302 provide an additional path for heat dissipation.

In the foregoing specification, the invention has been described with reference to specific examples of embodiments of the invention. It will, however, be evident that various modifications and changes may be made therein without departing from the broader spirit and scope of the invention as set forth in the appended claims.

For example, the material of the semiconductor dies described herein can be any semiconductor material or combinations of materials, such as gallium arsenide, silicon germanium, silicon-on-insulator (SOI), silicon, monocrystalline silicon, the like, and combinations of the above.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Further, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device, comprising:
 a heat sink that comprises a heat sink element having a top surface and a bottom surface, and an integral tie bar extending outwardly from a side of the heat sink element;
 a semiconductor die attached to the top surface of the heat sink element;
 an insulating substrate that surrounds the heat sink element and the attached semiconductor die, wherein the insulating substrate includes an array of contacts extending from a first surface thereof to an opposing second surface thereof;

electrical connections connecting bonding pads on an active surface of the semiconductor die with the contacts of the insulating substrate; and a mold compound that covers the semiconductor die, the electrical connections, and the first surface of the insulating substrate, wherein the bottom surface of the heat sink element, the second surface of the insulating substrate, and a distal end of the tie bar are exposed.

2. The semiconductor device of claim 1, wherein the electrical connections comprise bond wires.

3. The semiconductor device of claim 2, wherein the array of contacts of the insulating substrate comprise metal plated vias.

4. The semiconductor device of claim 3, further comprising an array of electrically conductive balls attached to the array of contacts on the second surface of the insulating layer, the conductive balls allowing for external electrical communication with the semiconductor die.

5. The semiconductor device of claim 1, wherein heat generated by the semiconductor die is dissipated by way of the heat sink element and the tie bar.

6. The semiconductor device of claim 1, wherein the heat sink comprises three additional tie bars, wherein one of said additional tie bars extends from each side of the heat sink element.

* * * * *